United States Patent [19]

Ziger

[11] Patent Number: 5,607,800
[45] Date of Patent: Mar. 4, 1997

[54] METHOD AND ARRANGEMENT FOR CHARACTERIZING MICRO-SIZE PATTERNS

[75] Inventor: David H. Ziger, Altamonte Springs, Fla.

[73] Assignee: Lucent Technologies Inc., Murray Hill, N.J.

[21] Appl. No.: 388,934

[22] Filed: Feb. 15, 1995

[51] Int. Cl.⁶ .......................... G01N 21/55; G01B 11/02
[52] U.S. Cl. ...................... 430/8; 430/30; 356/445; 356/446; 356/448; 356/376; 250/341.1; 250/559.39; 250/559.24; 250/559.2; 382/145; 382/149; 382/151
[58] Field of Search .................. 430/8, 30; 356/445, 356/446, 448, 376; 250/341.1, 559.39, 559.24, 559.2; 382/145, 149, 151

[56] References Cited

U.S. PATENT DOCUMENTS

| | | | |
|---|---|---|---|
| 4,757,207 | 7/1988 | Chappelow et al. | 250/491.1 |
| 4,866,782 | 9/1989 | Sugie et al. | 382/22 |
| 5,101,111 | 3/1992 | Kondo | 250/560 |
| 5,184,021 | 2/1993 | Smith | 250/560 |
| 5,363,171 | 11/1994 | Mack | 355/68 |
| 5,436,463 | 7/1995 | Rostoker | 250/559.04 |

OTHER PUBLICATIONS

Anonymous, "Spectroscopic Pitch Measurement Technique," IBM Technical Disclosure Bulletin, v. 32(4B), Sep. 1989, pp. 391–392.

Anonymous, "Phase–Sensitive Overlay Analysis Spectrometry," IBM Technical Disclosure Bulletin, v. 32(10A), Mar. 1990, pp. 170–174.

*Primary Examiner*—Mark F. Huff

[57] ABSTRACT

A method and arrangement for characterizing features of a patterned material on an underlying layer is disclosed. According to the method, the patterned material is subjected to radiation including a range of wavelengths such that the patterned material absorbs more radiation than the underlying layer, and the underlying layer reflects more radiation than the patterned material. Zeroth order reflected radiation is measured and the reflectance measurement is expressed as a spectrum of the intensity of the reflected radiation as a function of the wavelength of the reflected radiation, or as an average reflectance over a range of wavelengths. The reflectance measurement can be correlated with features of the patterned material. An arrangement of equipment is disclosed for characterizing features of a patterned material according to the method.

19 Claims, 8 Drawing Sheets

METHOD AND ARRANGEMENT FOR CHARACTERIZING MICRO-SIZE PATTERNS

FIELD OF THE INVENTION

The present invention relates to characterizing features of a micro-size patterned layer, and more particularly to using radiation to characterize features of a micro-size patterned layer.

BACKGROUND OF THE INVENTION

Photolithographic techniques are often used to pattern features of miniature devices. In a typical application of the photolithographic technique, a layer of photoresist is deposited on a substrate or other device layer and then exposed to radiation of appropriate wavelength through a patterning mask. Certain regions of the photoresist layer are exposed, and others are not exposed, according to the pattern defined in the mask. Exposing the photoresist to radiation changes its solubility. After exposure, solvent is used to remove regions of higher solubility photoresist, leaving regions of "hardened" photoresist at sites on the device layer as dictated by the patterning mask.

The hardened photoresist protects the directly underlying device layer while the unprotected regions of the device layer surrounding such protected regions are removed by etching or some other suitable method. After etching the device layer, the hardened photoresist is removed. In this manner, a feature is created in the device based on the pattern defined in the mask.

It is clear that the photoresist layer must be accurately patterned to form features to exacting specifications in a device. It is desirable, therefore, to monitor the photolithographic process at various stages and on a periodic basis.

For example, it may be desirable to measure the thickness of photoresist prior to exposure and patterning. This may be done by subjecting the photoresist to ultraviolet light having a wavelength in the range of 300 to 800 nanometers (nm) and measuring the reflected radiation. The reflected radiation may be correlated to photoresist thickness. The general principle of this measurement technique is that the measured light reflected from a substrate is modulated by constructive and destructive optical interference from an overlying semi-transparent material such as photoresist. See Chopra, K. L., *Thin Film Phenomena*, p. 99 (McGraw Hill, 1969). The periodicity of the reflectance spectra can also be used to determine optical properties, such as refractive index.

Furthermore, it is useful to take measurements after patterning the photoresist. For example, in a typical application, a plurality of stripes of photoresist may be patterned on the surface of a substrate. The stripes are spaced from one another so that there are alternating regions of substrate covered by hardened photoresist and regions that are not covered by hardened photoresist. It may be desirable, for example, to measure the width of the stripes of photoresist. Such measurements have been typically performed by scanning electron microscopy (SEM).

The aforementioned arrangement of spaced stripes is usually referred to as a line and space pattern. Such micro-size line and space patterns are useful for forming diffractive elements such as lenses or gratings in semiconductors or glass, forming fluid flow microchannels in silicon or, more generally, for providing a variety of mechanical features in a substrate.

2

More recently, attempts have been made to measure patterns using scatterometry. In this technique, a pattern is subjected to light, such as from a laser, typically having a single wavelength. The light is usually directed toward the pattern at some angle to the normal. The light reflected from the pattern is reflected at various orders, i.e., angles relative to the incident light. The amount or intensity of light reflected at the various orders is measured. It may be possible to use such data to obtain quantitative information about the pattern, such as the line width of a line and space pattern. However, scatterometry is very sensitive to changes in the profile of the pattern, i.e., the height of lines, and requires relatively sophisticated correlation work to relate the reflected radiation to features of a pattern.

Other examples of characterization methods pertaining to photolithography, and equipment suitable for accomplishing such methods, are described in U.S. Pat. Nos. 5,363,171, 5,184,021, 4866,782 and 4,757,207. These patents, and all others mentioned in this specification, are incorporated herein by reference in their entirety.

Thus, there is a need for a method and arrangement for characterizing features of a micro-size patterned layer, such as a patterned photoresist, using reflected radiation.

SUMMARY OF THE INVENTION

The present invention provides a method and arrangement for characterizing micro-size features of a patterned material that is disposed on a substrate. According to the method, the patterned material is irradiated by radiation having a suitable range of wavelengths such that the patterned material absorbs more radiation than the substrate, and the substrate reflects more radiation than the patterned material. Further, such radiation should have a suitably short wavelength to resolve the micro-size features of the pattern. The intensity of the radiation reflected at the same angle, relative to the surface of the patterned material, as the incident radiation, i.e., zeroth order reflected radiation, is measured. A reflectance spectrum is defined by expressing the intensity of the reflected radiation as a function of the wavelength of the reflected radiation. The amplitude and interference pattern of the reflectance spectrum can be directly correlated with features of the patterned material.

In one embodiment of the present invention, UV radiation in the range of 200 to 300 nm may be used to characterize the micro-size line width of a line and space pattern formed of novolac containing photoresist on a silicon substrate.

BRIEF DESCRIPTION OF THE DRAWINGS

Further features of the invention will become apparent from the following detailed description of specific embodiments thereof when read in conjunction with the accompanying drawings wherein.

DETAILED DESCRIPTION OF THE INVENTION

Figure 1:
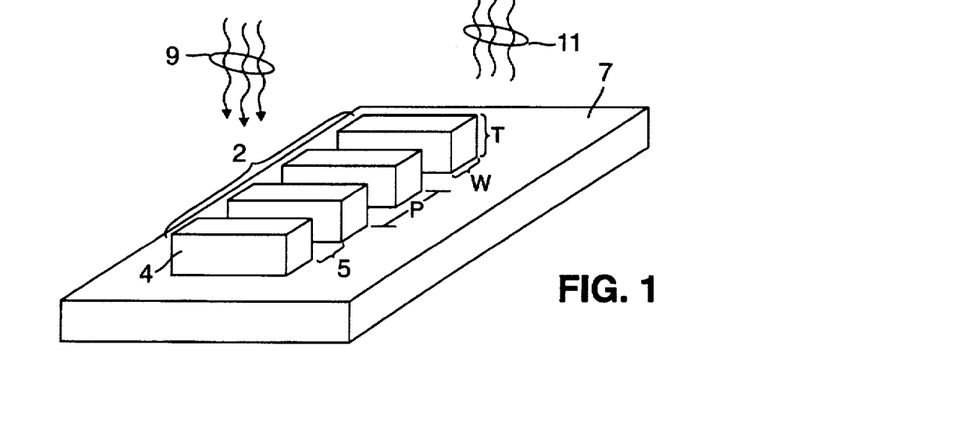
FIG. 1 shows an arrangement of a patterned film on a substrate.

The present invention is a method and arrangement for characterizing features of a patterned overlying layer or film of material that is disposed on a underlying layer or substrate, such as the patterned film 2 that is disposed on the substrate 7 shown in FIG. 1.

The "pattern" of the patterned film 2 is defined by the presence or absence of the film material over a region of the substrate 7. For example, in the arrangement shown in FIG. 1, successive stripes or lines 4 of film material, having a thickness T and a width W, and separated by spaces 5, define a line and space pattern. The spaces 5 are regions where film material is not present. Thus, the lines 4 of film material, and the spaces 5 between such lines 4, comprise the patterned film 2. Line and space patterns, such as the line and space pattern shown in FIG. 1, may be characterized by a pitch, P, which is defined as the width of the line 4 plus the width of the space 5 to the next line 4 comprising the pattern.

The present method and arrangement are useful for characterizing patterned films having micro-size features, such as the line width of a photoresist line and space pattern. Such line and space patterns may be used for forming diffractive elements such as lenses or gratings in semiconductors or glass, forming fluid flow microchannels in silicon or etching mechanical registration features in a substrate. As used herein, the phrase "micro-size features" refers to features on the order of 1 micron or less in size.

According to the present method, a patterned material, such as the patterned film 2 of FIG. 1, is subjected to radiation 9 of suitable wavelength. In particular, the incident radiation 9 includes a range of wavelengths such that the patterned film 2 absorbs more radiation than the substrate 7, and the substrate 7 reflects more radiation than the patterned film 2. Furthermore, such wavelengths must be sufficiently short to resolve the micro-size features of the pattern, for example the line width W. The radiation is usually directed substantially normal to the patterned material, though other angles of incidence are suitable. The intensity of the zeroth order reflected radiation 11 from the patterned film 2 and the substrate 7 is measured. A reflectance spectrum may be defined by expressing the intensity of the reflected radiation 11 as a function of the wavelength of the reflected radiation 11. As used herein, the terms "intensity or amount of the reflected radiation", "the amplitude of the reflectance signal" and "reflectance" are synonymous. Reflectance data may also be expressed as an average reflectance over the range of suitable wavelengths, which is useful for correlation development, as discussed in more detail later in this specification. As used herein, the term "reflectance measurement" generically refers to expressing reflectance data as a reflectance spectrum, as an average reflectance over a range of suitable wavelengths or in other formats suitable for the characterization or correlation purposes of the present invention.

Surprisingly, it has been discovered that the reflectance spectrum, obtained as described above, displays a periodic interference pattern over the range of suitable wavelengths as defined above. Furthermore, as the uncovered area of the substrate, such as the substrate 7 of FIG. 1, increases, so does the intensity of the reflected radiation 11.

Figure 2:
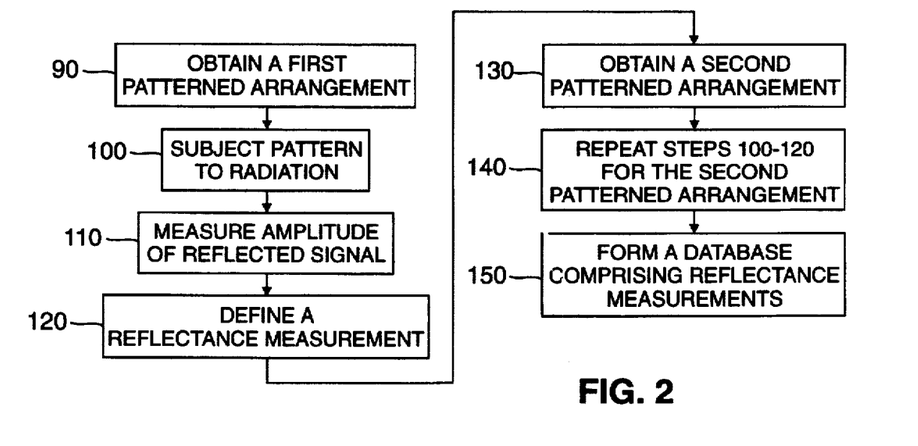
FIG. 2 is a flow chart illustrating an embodiment of a method of characterizing a pattern according to the present invention.

Thus, a pattern, such as a line and space pattern, may be characterized according to a first embodiment of the present invention, which is illustrated by steps 90 through 120 of the flow diagram shown in FIG. 2. In step 90, an arrangement comprising a patterned layer on a substrate, such as a line and space pattern on a wafer, is obtained. Typically, such an arrangement would be diverted from a lithographic processing line wherein mechanical features are photolithographically reproduced in, for example, a semiconductor arrangement. In step 100, the arrangement is illuminated by radiation. The radiation includes a range of wavelengths such that the film absorbs more radiation than the substrate, and the substrate reflects more radiation than the film. As will be appreciated by those skilled in the art, such information may be obtained by measuring the spectra of the film material and the substrate over a range of wavelengths or consulting optics reference texts. A relatively small amount of contrast, i.e., the reflectivity of the film versus the reflectivity of the substrate, is required. Obviously, the more sensitive and stable the optics for collecting the reflected radiation, the less contrast is required. Furthermore, the wavelength range described above should be suitable for resolving the micro-size features of interest of the patterned film. For example, if the line width of a line and space pattern is to be characterized, and the line width is about 0.5 micrometers (μm) (500 nm), suitable wavelength radiation for resolving the line width is less than about 300 nm. Based on empirical evidence, suitable wavelength radiation should have a maximum wavelength of about 65 percent of the size of the feature of interest.

In the next step 110, the amount of zeroth order reflected radiation from the patterned film and the substrate is measured. In step 120, a reflectance spectra is defined by expressing the reflectance as a function of the wavelength of the reflected radiation. Such a reflectance spectra uniquely characterizes the pattern. The Nanometrics 4000 Series, manufactured by Nanospec Corp. of Sunnyvale, Calif., the Prometrix 1050 UV, manufactured by Prometrix of Sunnyvale, Calif., or other equipment known to those skilled in the art that is suitable for subjecting a pattern to appropriate wavelength radiation and receiving and measuring the reflected radiation may be used to obtain the reflectance spectrum. Such equipment will be referred to herein as a spectral reflectometer. Preferably, the spectral reflectometer should include a suitably programmed processor for collecting and processing the reflectance data, i.e., defining a reflectance spectrum or the like. Alternatively, a separate processor, such as a suitably programmed computer, may be used for data processing. The spectral reflectometer should be capable of measuring zeroth order reflected radiation. In use, the spectral reflectometer is adjusted so that its light source, typically a broad band source, is focussed over the pattern to be characterized. The beam from the light source typically illuminates an area about 70 μm×70 μm. The user also selects the range of wavelengths over which the reflectance data is to be measured. An exemplary spectral reflectometer is described in more detail below in conjunction with a description of an arrangement according to the present invention.

A second embodiment of the present invention is described by steps 90 through 150 of FIG. 2. Once the first arrangement is characterized according to steps 90 through 120, a second arrangement is obtained for characterization according to step 130. As indicated in step 140, steps 100 through 120 are then repeated for the second arrangement. This may be repeated for a third and further arrangements. Finally, in step 150, the reflectance measurements of the arrangements may be organized as a database or otherwise archived. Such a data base may be stored in the memory of a suitably programmed computer by methods known to those skilled in the art.

A specific application of the first and second embodiments of the present invention are discussed below in conjunction with FIGS. 3A, 3B and 4. These Figures illustrate the suitability of using a reflectance spectrum to uniquely characterize a patterned layer.

Figure 3A:
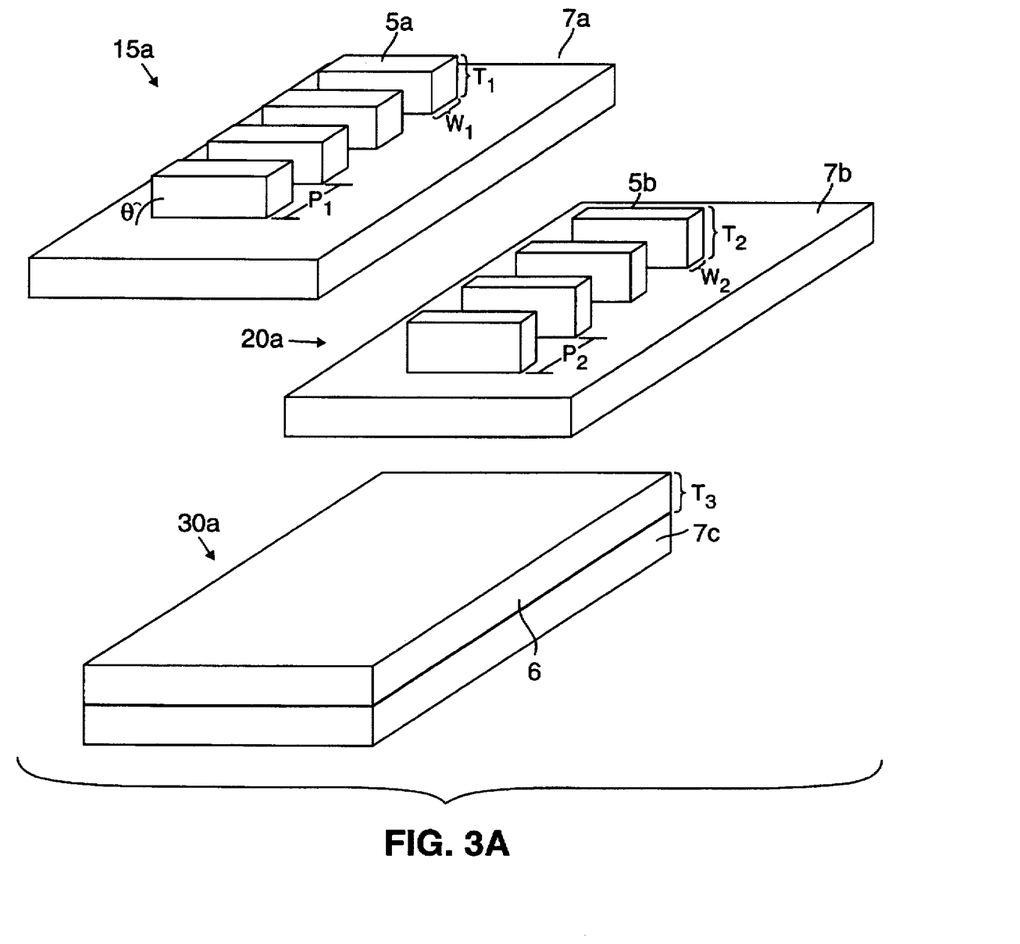
FIG. 3A shows several arrangements of novalac photoresist on a silicon substrate.
Figure 3B:
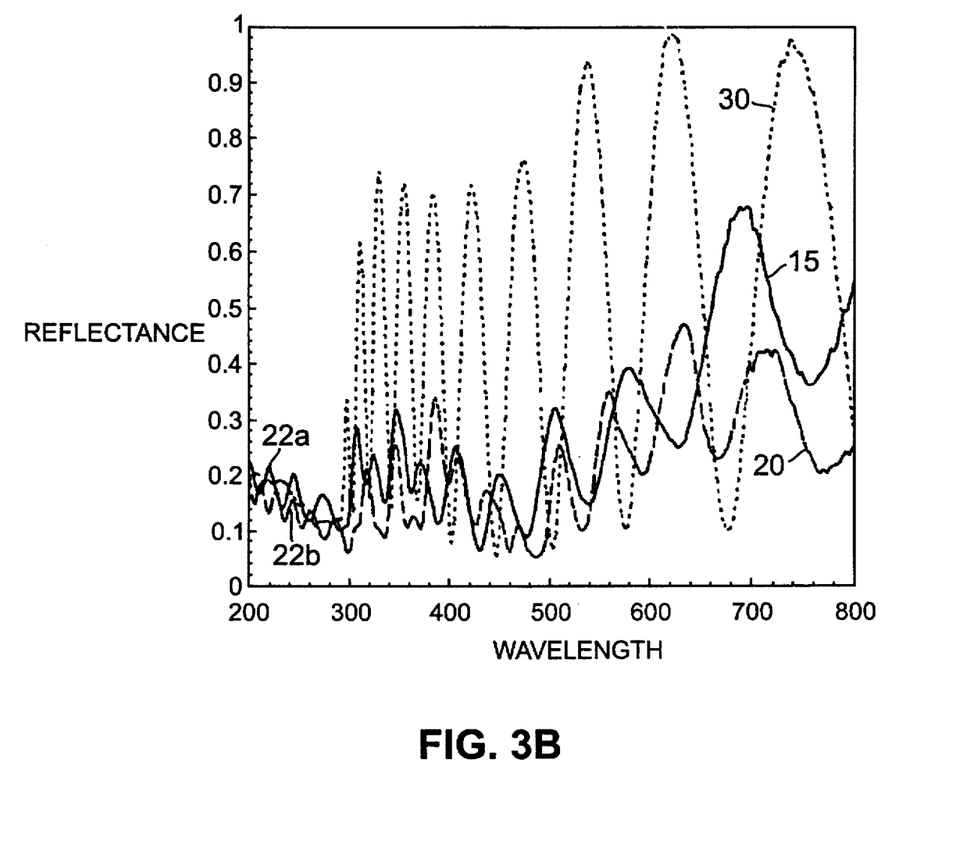
FIG. 3B shows reflectance spectra for the arrangements of FIG. 3A.

FIG. 3A shows three arrangements 15a, 20a and 30a of photoresist on a silicon substrate. FIG. 3B shows three reflectance spectra 15, 20 and 30 which were obtained using the Nanometrics 4000 Series spectral reflectometer by illuminating the arrangements 15a, 20a and 30a, respectively, with radiation. In particular, the reflectance spectra 15, 20 and 30 were obtained by subjecting the arrangements 15a, 20a and 30a to ultraviolet light (UV) consisting of a plurality 0f wavelengths from about 200 to 800 nm.

The arrangements 15a and 20a were micro-size line and space patterns formed from novalac containing photoresist on a silicon substrate 7a, 7b. The arrangements 15a and 20a both had a pitch $P_1$, $P_2$, respectively, of 1.0 μm and a line width $W_1$, $W_2$, of about 0.5 and 0.4 μm, respectively. The lines 5a of photoresist comprising the arrangement 15a had a thickness $T_1$ of 1.175 μm, and the lines 5b of the arrangement 20a had a thickness $T_2$ of 1.70 μm. For such an arrangement, radiation between about 200 to 300 nm, referred to as deep UV (DUV), is absorbed more strongly by the lines of photoresist 5a, 5b than the substrate 7a, 7b, reflected more strongly by the substrate than the lines of photoresist, and is suitable for measuring line widths of 0.4–0.5 μm. Such a range of wavelength is therefore within the teachings of the present invention.

The arrangement 30a comprises a layer 6 of unpatterned novalac containing photoresist on a silicon substrate 7c. The layer 6 of unpatterned photoresist had a thickness $T_3$ of 1.175 μm. The spectra 30 for the unpatterned layer 6 of photoresist of arrangement 30a is relatively flat in the DUV. The spectra 30 does not show the regular interference patterns, at DUV wavelengths, which the spectras 15 and 20 for the patterned photoresist exhibit.

There are more interference fringes 22b in the reflectance spectrum 20 than interference fringes 22a in the reflectance spectrum 15. The increase in interference fringes in the reflectance spectrum 20 may be due to the comparatively thicker lines 5b of photoresist of the arrangement 20a in comparison to the lines 5a of the arrangement 15a. At wavelengths above about 300 nm, the photoresist becomes substantially more transparent to UV. Consequently, the reflectance spectra 15 and 20 are a convolution of reflectances from the air/photoresist interface, the air/substrate interface and the photoresist/substrate interface. This portion of the spectrum may contain some useful information, but, for the particular arrangements discussed in FIG. 3A, is not within the teachings of the present invention. Note that in the region from 200 to 300 nm, the reflectance spectra will be free from reflectances from the photoresist/substrate interface since the photoresist absorbs more light in this region of the spectrum.

Thus, the spectrum 15 from about 200 to 300 nm uniquely characterizes a novalac on silicon line and space pattern having a pitch $P_1$ of 1.0 μ,μm and lines 5a that have a width $W_1$ of 0.5 μm and a thickness $T_1$ of 1.175 μm. Likewise, the spectrum 20 from about 200 to 300 nm uniquely characterizes a novalac on silicon line and space pattern having a pitch $P_2$ of 1.0 μm and lines 5b that have a width $W_2$ of 0.4 μm and a thickness $T_2$ of 1.70 μm. As will be discussed later in this specification, information contained in this portion of the spectrum may be correlated to features of the pattern. Subjecting an unpatterned layer, however, such as the layer 6 of unpatterned novalac photoresist of arrangement 30a, to radiation below 300 nm, provides little if any useful information. This is because radiation of this wavelength is substantially absorbed by the novalac photoresist and there are no spaces or gaps in the unpatterned layer 6 so that radiation reflected from the substrate 7c creates the interference patterns observed for spectra 15 and 20. For this reason, the prior art method of measuring the thickness of a photoresist layer is accomplished using the longer wavelength portion of the spectrum, i.e., above 300 nm for novalac photoresist.

Note that the profile angle θ (see FIG. 3a, arrangement 15a) of the lines of a line and space pattern, i.e., the angle described by the stripes or lines of photoresist relative to the substrate, was constant for the above arrangements. Substantial variations in the profile angle θ may affect the reflectance spectrum.

A reflectance measurement of a pattern, such as a line and space pattern, having a particular size and configuration is substantially reproducible. FIG. 4 shows the reflectance spectra of wafers that were processed under identical conditions to produce a line and space pattern, similar to arrangements 15a and 20a, of novalac photoresist on silicon. The nominal line width of the pattern was 0.5 μm. The pattern had a pitch of the 1.0 μm. The thickness of the lines was 1.175 μm. The reflectance spectra of FIG. 4 are collectively given the reference numeral 50. As can be seen from FIG. 4, the six reflectance spectra comprising the spectra 50 are substantially identical.

Figure 4:
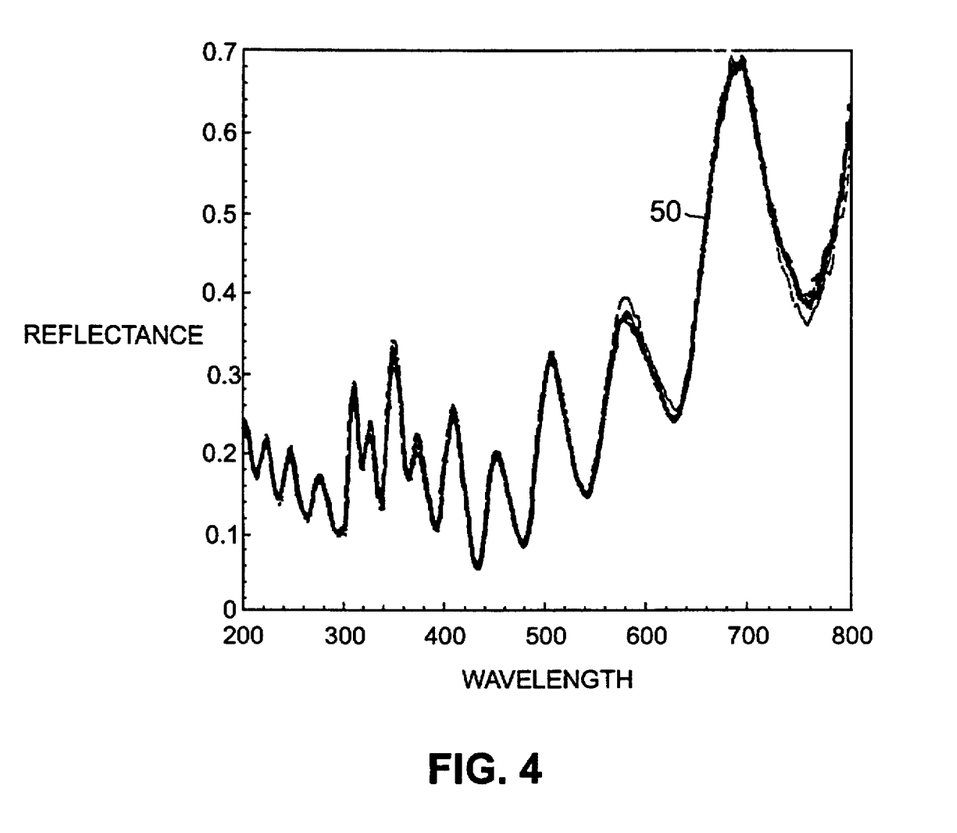
FIG. 4 illustrates the repeatability of the reflectance spectra.

As shown in FIG. 4, the reflectance spectrum of a patterned layer is reproducible outside of the range of wavelengths taught by the present invention. However, the portion of the spectrum not included within the present teachings is less readily correlatable to pattern feature size than the portion of the spectra within the present teachings, if correlatable at all. This is of particular significance for some of the following embodiments wherein the method of the present invention may be used to obtain quantitative information about a feature of a patterned layer, such as the micro-size line width of a line and space pattern. Such further embodiments of a method according to the present invention are illustrated by flow chart and block flow diagram in FIGS. 5A–5D and described below.

Figure 5A:
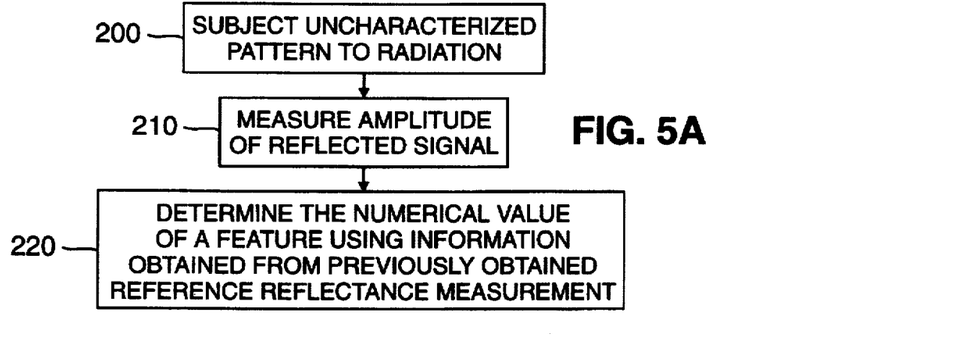
FIG. 5A is a flow chart illustrating an embodiment of a method according to the present invention for obtaining quantitative information about a patterned layer using previously obtained reflectance spectra.

In step 200, an arrangement comprising a patterned layer on a substrate is subjected to radiation. In the next step 210, the radiation reflected from the arrangement is measured. The numerical value of the feature is determined in step 220 by using information obtained from previously obtained reflectance measurements. Step 220 may be accomplished using a number of methods, two examples of which are described below.

Figure 5B:
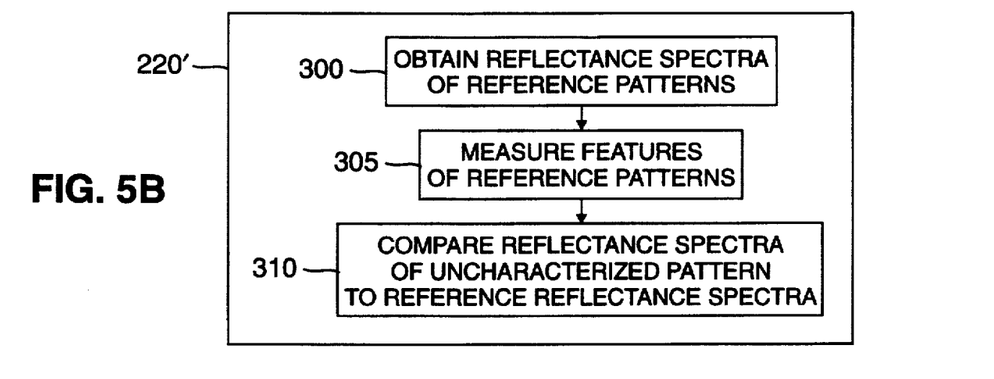
FIG. 5B is a flow chart illustrating a first embodiment of the method for determining quantitative information about a patterned layer using previously obtained reflectance spectra.

In a first embodiment, illustrated in FIG. 5B, archived data, obtained in steps 300 and 305, is compared, in step 310, with the reflectance spectrum of an uncharacterized pattern. The archived data or data base is obtained according to steps 300 and 305 wherein a number of reference patterns are formed and reflectance spectra are then obtained for such reference patterns. Features of interest for each reference pattern are measured by SEM or other suitable method. The reference reflectance spectra and measured values for features of interest for each reference pattern are organized into a data base or archive by methods known to those skilled in the art. By matching an uncharacterized pattern to an archived reference reflectance spectra, a value, i.e., the size of a feature of interest, may be determined.

Figure 5C:
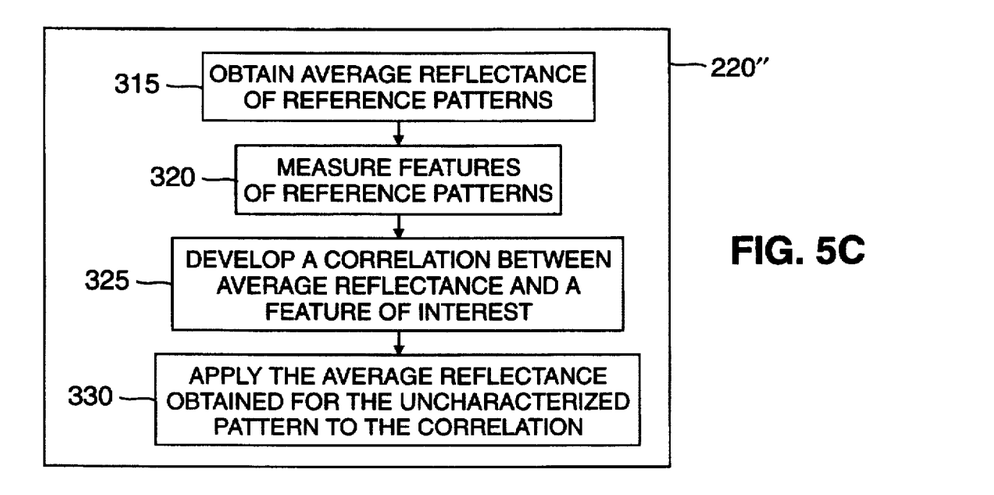
FIG. 5C is a flow chart illustrating a second embodiment of the method for determining quantitative information about a patterned layer using previously obtained reflectance spectra.

In a second embodiment, illustrated in FIG. 5C, the numerical value of a feature may be determined by developing a correlation between the feature and reflectance. According to the second embodiment, reflectance measurements are obtained for a plurality of reference patterns of known structure. The numerical value of a feature of interest is regressed against the reflectance of the reference patterns over the range of suitable wavelengths, as previously described. The numerical value of the feature may then be expressed as a function of the reflectance. The correlation may be expressed algebraically or graphically. When developing a correlation as described above, it is preferable to use the average reflectance over a range of wavelengths. Alternatively, the reflectance at the periodic maxima within a given reflectance spectra can be used. A linear regression may be used.

Figure 5D:
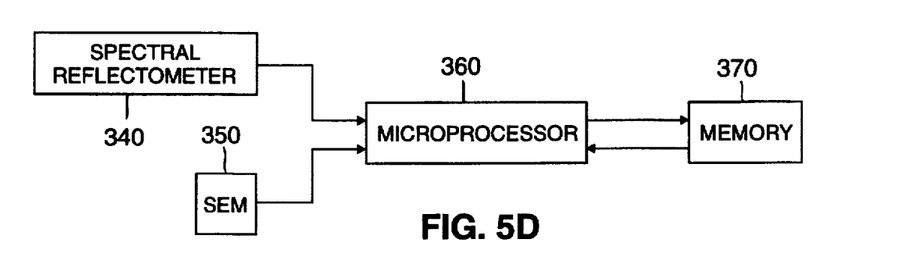
FIG. 5D is an exemplary arrangement for characterizing a patterned layer according to the present invention.

The steps discussed in FIGS. 5A–5C may be accomplished by the exemplary arrangement of equipment shown in FIG. 5D. The archived data or data base of reference reflectance measurements and measured values of various features of interest, such as the line width of a line and space pattern, may be obtained as follows. Reflectance measurements for a plurality of patterns are first obtained by equipment such as a spectral reflectometer 340 suitable for such purpose. Suitable reflectometers include the Nanometrics 4000 Series or the Prometrix 1050 UV.

Figure 5E:
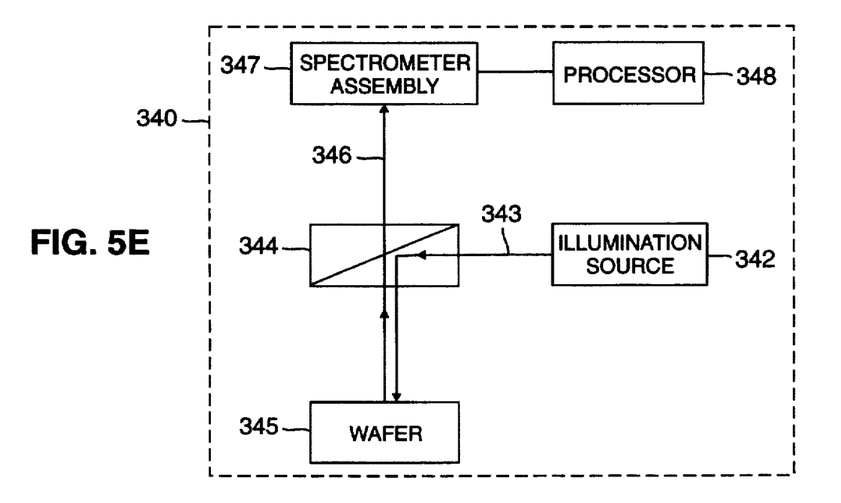
FIG. 5E is an exemplary block diagram of a spectral reflectometer suitable for use in the arrangement of FIG. 5D.

A simplified block diagram of a spectral reflectometer 340 is shown in FIG. 5E. Radiation is provided by an illumination source 342. The illumination source 342 is typically a broadband source such as xenon arc lamp. Such a source typically provides radiation ranging in wavelength from about 220 to 800 nm. Illumination source 342 may also include various filters, shutters, a focus aperature and various drive solenoids and stepper motors, not shown in the Figure. Radiation from the illumination source 342 is focussed on a beam splitter 344. One beam, not shown, generated by the beam splitter 344 functions as a reference. This reference beam is guided to the spectrometer assembly 347 for processing. The other beam, identified by the reference numeral 343, is directed toward a wafer 345 and focused over the pattern to be characterized. Reflected radiation 346 is received by the spectrometer assembly 347. In the spectrometer assembly, reflected radiation 346 is typically resolved into its spectral components by a grating. Each spectral component of the reflected radiation 346, i.e., radiation of a particular wavelength, is reflected off the grating to a location dictated by that particular wavelength. Photodetectors positioned at such locations receive the radiation and generate an electrical signal proportional to the amount of incident radiation. Thus, a signal generated by a particular photodetector is associated with radiation having a particular wavelength. The various signals generated by the activated photodetectors are processed by the processor 348. A reflectance spectrum, average reflectance over a wavelength range or other expression of the amount of reflected radiation for a corresponding wavelength may then be calculated. The aforementioned discussion of the spectral reflectometer 340 is intended to provide an overview of its operation and some of its important elements. As known to those skilled in the art, the spectral reflectometer 340 typically includes other elements, not shown, for accomplishing various other functions.

Returning to the arrangement of FIG. 5D, a measurement device 350 is used to directly measure features of the plurality of patterns. A scanning electron microscope, such as the S7000 by Hitachi, Ltd. is suitable for performing such measurements. A suitably programmed microprocessor 360 receives, either directly or indirectly, the reflectance measurements and direct measurement data from the spectral reflectometer 340 and the measurement device 350 and stores such information in memory 370. Thus, for each pattern, a reflectance measurement, as well as values representative of measurements of features of the pattern, are stored in memory 370. Such information forms the archive or data base.

The microprocessor 360 is preferably programmed to regress the reflectance measurement and direct measurment data stored in memory 370 to develop a correlation as discussed above in conjunction with FIG. 5C.

Once a data base has been created in memory 370, the arrangement depicted in FIG. 5D may be used to determine the numerical value of a feature of an unmeasured pattern as follows. A reflectance spectrum may be obtained for an unmeasured pattern using the spectral reflectometer 340. Such spectral information is received by the microprocessor 360 which is suitably programmed to compare the reflectance spectrum to the reference reflectance spectra stored in the memory 370. If a match is found between reflectance spectra stored in memory and the reflectance spectra corresponding to the unmeasured pattern, then the reference pattern and the unmeasured pattern are substantially identical. Measurement data from memory 370 corresponding to the matching reference pattern is displayed. Thus, the size of a feature of an unmeasured pattern may be determined. If an average reflectance value, rather than a full reflectance spectra, is obtained from the spectral reflectometer 340, then such a value may be used to estimate the size of a feature by applying a previously developed correlation, as discussed above, to the average reflectance value.

This exemplary method is particularly well-suited for applications having one degree of freedom. For example, for a line and space pattern, the thickness T and profile angle θ of the lines, such as lines 5a and 5b of FIG. 3A, and the pitch of the pattern should be invariable, the variable being the line width W. If the only variable is the line width W, then differences in the reflectance spectra obtained for different line and space patterns result from differences in the line width W of such patterns. Thus, the line width W of the pattern being measured is equal to the line width of the pattern from which the matching reference reflectance spectra was obtained. Alternatively, line width may be held constant and some other parameter may be varied.

Specific examples of using the present invention to obtain quantitative information regarding a pattern are discussed below in conjunction with FIGS. 6 and 7.

Figure 6:
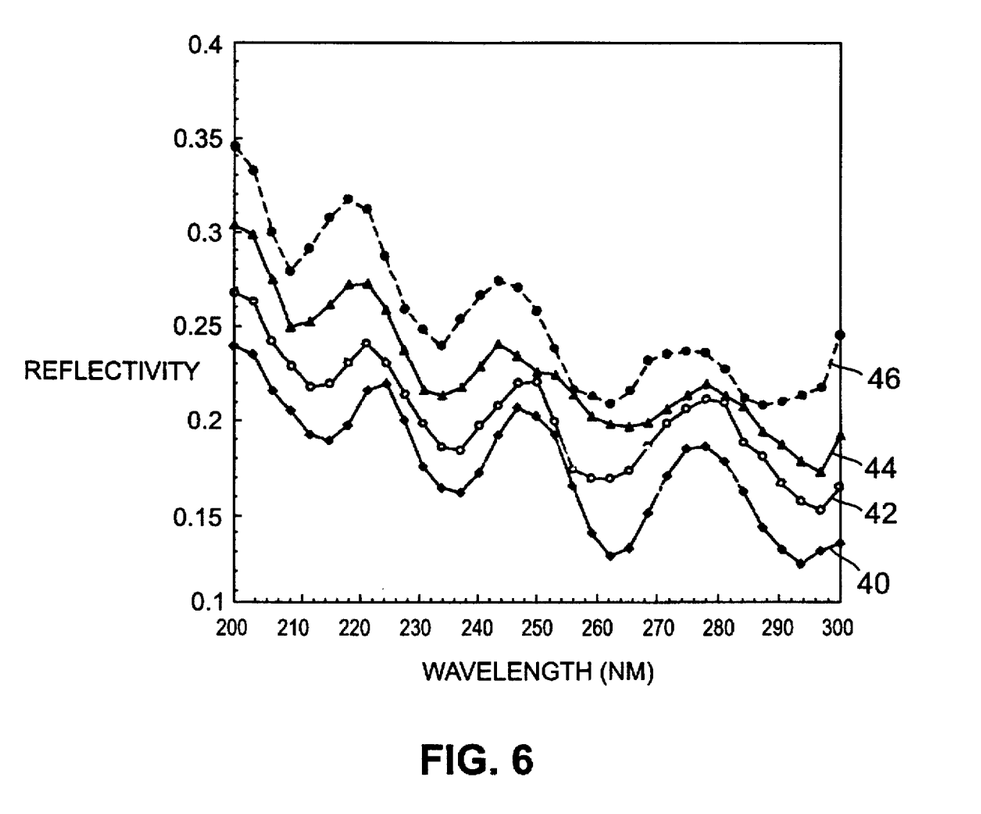
FIG. 6 shows reflectance spectra for patterned photoresist where the line size of the pattern varies.
Figure 7:
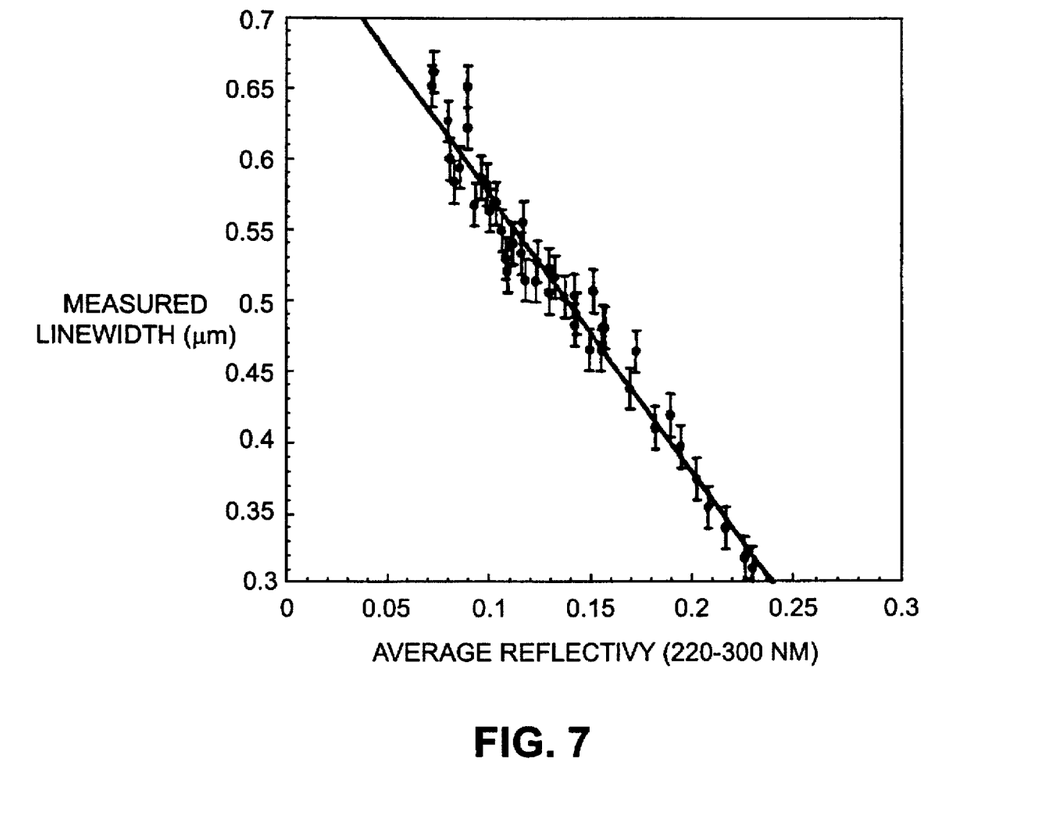
FIG. 7 shows a correlation between measured linewidth and average reflectivity.

FIG. 6 shows four reflectance spectra 40, 42, 44 and 46 that were obtained for four arrangements, 40a, 42a, 44a and 46a, respectively, using the Nanometrics 400 Series spectral reflectometer. The arrangements, not shown, comprised patterned novalac photoresist on silicon. The patterned photoresist of arrangements 40a, 42a, 44a and 46a was patterned into line and space patterns, similar to those shown in FIGS. 1 & 3A. The line and space pattern of each of the arrangements 40a–46a had a 1.0 µm pitch. The thickness and profile angle of the lines and of the four patterns was substantially the same. The line width of the lines of the four patterns was different, however, decreasing from a maximum line width in arrangement 40a to a minimum width in arrangement 46a.

It can be seen from the four spectra 40–46 that the average reflectance, over a range of wavelengths, increases as the line width decreases. According to the present invention, linewidth can be expressed as a function of average reflectance. FIG. 7 illustrates such a correlation 60 between line width and reflectance between 220 to 300 nm for such a 1.0 µm pitch line and space pattern. The correlation 60 shown in FIG. 7 may be represented algebraically by the following equation, $LW=0.703-1.746*Ref_{(220-300\ nm)}$, where LW is the line width in µm of a line and space pattern, and $Ref_{(220-300\ nm)}$ is the average reflectance as measured over the range of 220 to 300 nm.

Figure 8A:
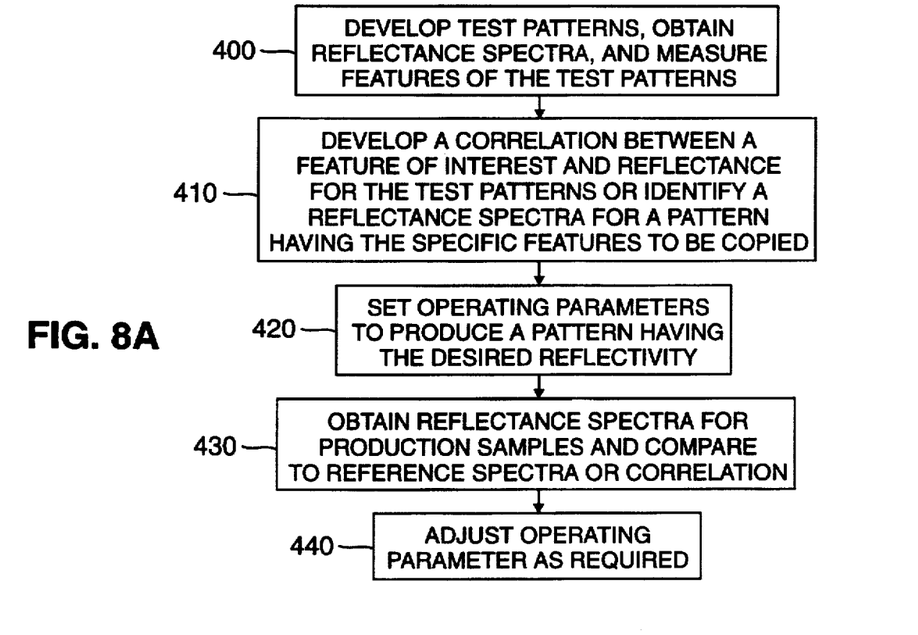
FIG. 8A is a flow chart illustrating a method according to the present invention for controlling a photolithographic writing process.
Figure 8B:
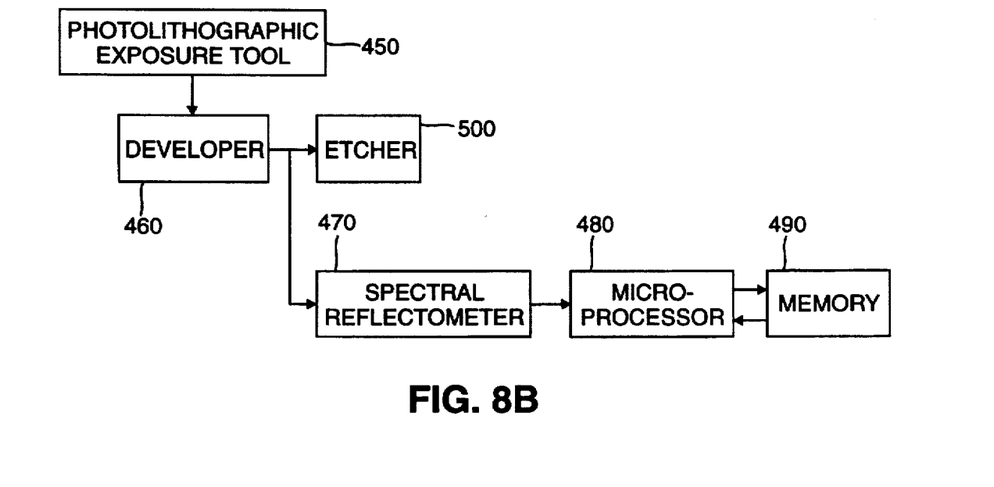
FIG. 8B is an exemplary arrangement according to the present invention for providing quality control for a lithographic writing process.

In a further embodiment, illustrated in FIGS. 8A and 8B, a method in accordance with the present invention may be used for quality control of a lithographic writing process. A lithographic writing process may be used to produce a pattern having desired features and feature size. A number of parameters affect the ability to produce a pattern having desired features using such a process. For example, the age of photoresist being patterned, the chemical composition of the photoresist developer solution, and, perhaps most importantly, the dose of radiation used to expose the photoresist will all affect the resulting pattern. As such, it is desirable to routinely monitor the pattern being produced.

According to step 400 of FIG. 8A, test patterns are developed, reflectance measurements are obtained and features of the test patterns are measured by suitable means such as SEM. In step 410, the feature of interest, such as the line width of a line and space pattern, may be correlated to reflectance according to the present invention. Alternatively, a reference reflectance spectrum is obtained for a pattern having the specific features to be reproduced in the manufacturing process. According to step 420, the operating parameters of the writing process are then set to produce a pattern having a specific reflectance, i.e., one which will result in a pattern having a desired feature, such as a 0.5 µm line width. In step 430, regular production patterns are periodically sampled, preferably according to statistical methods, and a reflectance measurement is obtained for each sampled pattern. The reflectance measurement for each sampled pattern is then compared, as appropriate, to the reference spectrum or correlation. If the reflectance measurement from a sampled pattern deviates from the reference or correlation, then the pattern being produced is off-specification. Once alerted to off-specification production, the operator of the lithographic writing process may check the various parameters to determine what parameter should be adjusted, as indicated in step 440.

The aforementioned steps may be accomplished by the exemplary arrangement of equipment depicted in FIG. 8B. A wafer, coated with photoresist, such as SPR-513 resist, is placed within a photolithographic exposure tool 450. In the photolithographic exposure tool 450, the photoresist is exposed to radiation, typically UV, through a patterned mask. A suitable exemplary photolithographic exposure tool 450 is a stepper, well known to those skilled in the art. Several exemplary steppers are described in U.S. Pat. Nos. 4,616,908, 4,206,494 and 4,425,037. Next, the photoresist layer is developed in developer 460. Tetra- methyl-ammonium-hydroxide is typically used as a developer fluid. Development yields the patterned layer, which may have the form of a line and space pattern, for example. For continued processing, the patterned wafer is next etched in an etcher 500 and then the photoresist remaining on the wafer is removed. In this manner, a pattern, such as a line and space pattern, may be etched into the wafer to form a mechanical feature such as a optical diffraction grating.

On a periodic basis, wafers may be diverted, after development, from the etcher to a spectral reflectometer 470 wherein a reflectance measurement is obtained. Such spectral information is then received by a microprocessor 480 which is programmed to compare such information to a reference pattern or apply it to a correlation stored in a memory 490. Such a reference pattern or correlation is stored in memory as previously discussed. If a deviation exists between the reflectance measurement from the diverted sample and that of the reference, then an operator is alerted by a visual or audible alarm that off-specification patterns are being produced and that the operation should be checked and adjusted as appropriate.

It should be understood that while the embodiments described herein are illustrative of the principles of this invention and that various modifications may occur to, and be implemented by, those skilled in the art without departing from the scope and spirit of the invention. For example, the method of the present invention may be used to quantify features other than the line width of a line and space pattern. Further, while the embodiments discussed herein are directed to applications wherein the substrate is generally more reflective than the patterned layer, the contemplated scope of the present invention includes arrangements wherein the patterned layer is generally more reflective than the substrate and wherein the arrangement is irradiated by radiation having a suitable range of wavelengths such that the patterned material reflects more radiation than the substrate, and the substrate absorbs more radiation than the patterned material.

I claim:

1. A method for characterizing an arrangement having a patterned layer of photoresist disposed on an underlying layer, the patterned layer of photoresist having a micro-size first feature, comprising the steps of:

(a) subjecting the arrangement to radiation having a range of wavelengths such that the patterned layer of photoresist absorbs more radiation than the underlying layer, and the underlying layer reflects more radiation than the patterned layer of photoresist, and further characterized by a range of wavelengths suitable for measuring the first feature of the patterned layer of photoresist;

(b) measuring the zeroth order reflected radiation from the arrangement;

(c) expressing the amount of zeroth order reflected radiation as a reflectance measurement; and

11

(d) comparing the reflectance measurement for the arrangement to reflectance measurements obtained for a plurality of reference arrangements each having a patterned layer of photoresist disposed on an underlying layer, the plurality of reference arrangements collectively comprising a multiplicity of features, which features differ from each other and first feature by the size of the feature.

2. The method of claim 1 wherein the patterned layer of photoresist is a line and space pattern defined by a plurality of stripes of photoresist.

3. The method of claim 2 wherein the photoresist comprises a novalac resin and wherein the underlying layer is silicon and the radiation that the arrangement is subjected to comprises wavelengths from about 200 to 300 nanometers.

4. The method of claim 3 wherein the stripes of photoresist are characterized by a width, and the first feature of the patterned layer is the width of the stripes of photoresist, and the multiplicity of features are the width of the stripes of photoresist of the plurality of reference patterns.

5. The method of claim 1 wherein a plurality of values are obtained, wherein each value of the plurality is indicative of the one of the features of the multiplicity.

6. The method of claim 5 wherein the reflectance measurement is an average reflectance and wherein the reflectance measurements and the plurality of values are used to develop a correlation that can predict a first value indicative of the first feature as a function of the average reflectance and step (d) further comprises applying the correlation to the reflectance measurement of the arrangement to determine the first value.

7. The method of claim 6 wherein the patterned layer of photoresist is a line and space pattern defined by a plurality of stripes of photoresist.

8. The method of claim 7 wherein the stripes of photoresist are characterized by a width, and the first feature of the patterned layer is the width of the stripes of photoresist, and the multiplicity of features are the width of the stripes of photoresist of the reference arrangements.

9. A method for characterizing a first arrangement having a line and space pattern of material disposed on a substrate, wherein the line and space pattern is characterized by a micro-size line width, comprising the steps of:

(a) subjecting the first arrangement to radiation having a range of wavelengths such that the material absorbs more radiation than the substrate, and the substrate reflects more radiation than the material, and further characterized by a range of wavelengths suitable for measuring the line width;

(b) measuring the zeroth order reflected radiation from the first arrangement;

(c) expressing the amount of zeroth order reflected radiation as a reflectance measurement; and (d) measuring the line width of the line and space pattern, wherein, the first arrangement is characterized by associating the reflectance measurement with the measured line width obtained in step (d).

10. The method of claim 9 wherein scanning electron microscopy is used for measuring the line width of the line and space pattern.

11. The method of claim 9 wherein the measurement of the line width of the line and space pattern of the first arrangement, and a reference reflectance measurement comprising the reflectance measurement for the first arrangement, are organized into a data base.

12. The method of claim 11 further comprising the step of determining line width of a second arrangement having a line and space pattern of material disposed on a substrate, wherein the line width of the second arrangement is determined by obtaining a reflectance measurement for the second arrangement by repeating steps (a) through (c); and comparing the reflectance measurement for the second arrangement to the data base.

13. The method of claim 12 wherein the material is photoresist comprising novalac resin, the substrate is silicon, and wherein step (a) further comprises subjecting the first arrangement to radiation comprising wavelengths from about 200 to 300 nanometers.

14. A method for determining a numerical value for a microsize first feature of a first patterned layer disposed on an underlying layer, the first patterned layer characterized by a first pattern, comprising the steps of:

(a) irradiating the first patterned layer with radiation having a range of wavelengths such that the first patterned layer absorbs more radiation than the underlying layer, and the underlying layer reflects more radiation than the first patterned layer, and wherein the range of wavelengths is suitable for measuring the first feature of the first patterned layer;

(b) measuring a reflectance signal, which signal corresponds to the zeroth order reflected radiation from the first patterned layer and the underlying layer; and (c) determining the numerical value using information obtained from reference reflectance measurements, obtained according to steps (a) and (b).

15. The method of claim 14 wherein the step of determining the numerical value further comprises comparing the reflectance signal from the first patterned layer to a data base formed from the reference reflectance measurements comprising reflectance signals and corresponding numerical values and matching the reflectance signal to one of the reference reflectance measurements which has substantially the same reflectance signal.

16. The method of claim 14 wherein an average reflectance over the range of wavelengths is obtained from the reflectance signal measured in step (b) and wherein the step of determining the numerical value further comprises applying a correlation that provides a numerical value as a function of average reflectance to the reflectance signal measured in step (b).

17. The method of claim 15 wherein the first pattern is a line and space pattern defined by a plurality of spaced lines formed of novalac containing photoresist, and wherein the first pattern is characterized by a pitch and the lines are characterized by a width and wherein the first feature of the pattern is the width of the lines, and wherein the underlying layer is silicon, and the radiation irradiating the line and space pattern comprises wavelengths about 300 nanometers or less.

18. The method of claim 16 wherein the first pattern is a line and space pattern defined by a plurality of spaced lines formed of novalac containing photoresist, and wherein the first pattern is characterized by a pitch and the lines are characterized by a width and wherein the first feature of the pattern is the width of the lines, and wherein the underlying layer is silicon, and the radiation irradiating the line and space pattern comprises wavelengths about 300 nanometers or less.

19. A method for characterizing an arrangement having a patterned layer disposed on an underlying layer, the patterned layer having a micro-size first feature, comprising the steps of:

(a) subjecting the arrangement to radiation having a range of wavelengths such that the patterned layer reflects more radiation than the underlying layer, and the underlying layer absorbs more radiation than the patterned layer, and further characterized by a range of wavelengths suitable for measuring the first feature of the patterned;

(b) measuring the zeroth order reflected radiation from the arrangement;

(c) expressing the amount of zeroth order reflected radiation as a reflectance measurement; and (d) comparing the reflectance measurement for the arrangement to reflectance measurements obtained for a plurality of reference arrangements each having a patterned layer disposed on an underlying layer, the plurality of reference arrangements collectively comprising a multiplicity of features, which features differ from each other and first feature by the size of the feature.

* * * * *